United States Patent [19]

Garry

[11] 4,015,987

[45] Apr. 5, 1977

[54] PROCESS FOR MAKING CHIP CARRIERS USING ANODIZED ALUMINUM

[75] Inventor: Robert F. Garry, Sunnyvale, Calif.

[73] Assignee: The United States of America as represented by the Secretary of the Navy, Washington, D.C.

[22] Filed: Aug. 13, 1975

[21] Appl. No.: 604,392

[52] U.S. Cl. .................................. 96/36.2; 96/36; 96/38.4; 204/15; 156/632; 156/643; 156/644; 156/665

[51] Int. Cl.² .......................................... G03C 5/00

[58] Field of Search ................... 156/21, 22, 3, 8; 96/36, 38.4, 36.2; 148/1.5, 187; 204/15

[56] References Cited

UNITED STATES PATENTS

| 3,165,672 | 1/1965 | Gellert | 156/3 UX |
|---|---|---|---|
| 3,294,653 | 12/1966 | Keller et al. | 156/22 |
| 3,416,975 | 12/1968 | Webb | 156/22 |
| 3,532,569 | 10/1970 | Gould | 156/22 |
| 3,715,250 | 2/1973 | Altman | 156/22 |
| 3,784,440 | 1/1974 | Grunwald et al. | 156/3 |
| 3,928,658 | 12/1975 | Van Boxtec et al. | 156/22 |

OTHER PUBLICATIONS

"Artwork for Photofabrication," Kodak, 1963, p. 8.
"Photofabrication of Printed Circuits," Kodak, 1968, pp. 11, 17, 19, 20–22.

*Primary Examiner*—Edward C. Kimlin
*Attorney, Agent, or Firm*—R. Sciascia; R. Beers; S. Sheinbein

[57] ABSTRACT

A process for making chip carriers using an anodized aluminum substrate includes punching registration holes and center holes in the aluminum substrate, anodizing the aluminum and laminating copper foil to the substrate. Photo resist, etching and plating steps follow.

5 Claims, 2 Drawing Figures

PROCESS FOR MAKING CHIP CARRIERS USING ANODIZED ALUMINUM

BACKGROUND OF THE INVENTION

The present invention relates to a process for fabricating chip carriers and especially carriers with an anodized aluminum substrate.

Present processes for making chip carriers conventionally use a plastic substrate, such as a polyimide film. Such carriers are used for holding microelectronics integrated circuits and provide a means for holding the integrated circuits so they can be individually tested. The integrated circuit can also be "burned-in" while held in the carrier. The carriers must be suitable for manufacturing, testing and general handling of the chips and the anodized aluminum substrate has been found to be more stable than the plastic substrate, the anodized aluminum permitting more precise dimensions as well as higher continuous operating temperatures.

SUMMARY OF THE INVENTION

The present process provides a specific sequence of steps for making the chip carriers on an anodized aluminum substrate. The process includes punching holes in the substrate, grinding the substrate to remove burrs therefrom, anodizing the aluminum substrate and laminating thin copper foil to the top surface. These steps are followed by photo resist, etching and plating processes which can be accomplished by either of two sequences, or variations thereof.

OBJECTS OF THE INVENTION

An object of the invention is to provide a chip carrier substrate with precise dimensions.

Another object of the invention is to improve the stability of substrates used in making chip carriers.

A further object of the invention is to provide a chip carrier which can be used in an environment of relatively high operating temperatures.

Other objects, advantages and novel features of the present invention will become apparent from the following detailed description of the invention when considered in conjunction with the accompanying drawings.

DETAILED DESCRIPTION

The first step of the process involves selecting an aluminum substrate 10 in which registration holes 12 and center holes 14 are punched. The multiplicity of center holes 14 indicates that a plurality of parts can be made at the same time. Next, the substrate is ground or lapped to remove burrs created during the punching process, or to control thickness, surface flatness or parallelism. The aluminum is then anodized by conventional chemical or electrolytic means. The top surface is coated with an adhesive and a thin copper foil laminated thereto. Metals other than copper may be used.

The remaining steps involve photo resist, etching and plating processes, in which either one of two sequences can be followed. Sequence one involves coating the copper surface with photo resist, and printing and developing an image. The printing is conventionally done by masking the photo resist with a photo template registered to the substrate using pins and irradiating the exposed photo resist with ultraviolet lights. Methods other than pinning may be used to obtain registration.

Figure 1:
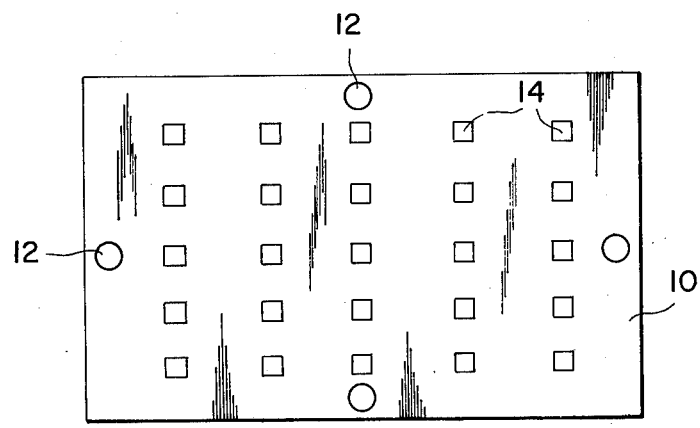
FIG. 1 is a top view of the substrate with the registration and center holes punched therein for multiple parts.
Figure 2:
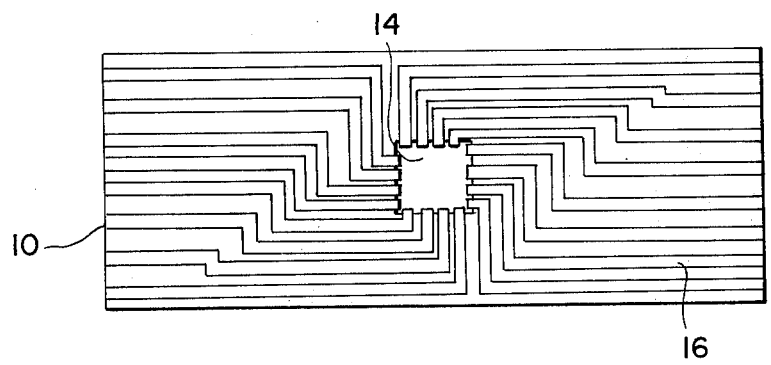
FIG. 2 is a close-up view of one of the parts being formed by the process.

FIG. 2 shows one such image. The back surface is coated with screen resist, photo resist or other etch resist to protect the copper extending over the punched center holes. This step is not required if traces of copper will not extend into the holes. The circuit in this case comprising fingers, or leads, 16 is then etched, the resist is removed and the top surface of the substrate is recoated with photo resist. The fingers, or leads, 16 are exposed and plated with thick nickel for abrasion resistance. The remainder of the circuit is now exposed, and it and the fingers are activated (cleaned and prepared for plating) and plated with gold. The resist is removed from the back surface and the outer periphery of the part is punched.

The second sequence for photo resist, etching and plating involves a number of the same steps as the first sequence. The copper surface is once again coated with photo resist, the photo template is pin-registered to the substrate, and the image is printed and developed as shown in FIG. 2. The back surface is coated with screen resist, photo resist or other plating resist to protect the copper extending over the punched holes. (Again, this step is not required if traces of the copper will now extend into the holes.) The circuit is plated with gold and the resist is removed. The entire circuit is then recoated with resist. The fingers 16, only, are exposed. The circuit is activated and the fingers 16 are plated with nickel to increase their thickness. The circuit is plated with gold, the resist is removed and the periphery is punched to separate the parts.

Either of the latter two sequences combine well with the process of forming the anodized aluminum substrate to provide a highly stable chip carrier. Thus there has been described an improved process for making chip carriers using anodized aluminum.

Obviously, many modifications and variations of the present invention are possible in light of the above teachings. It is therefore to be understood that, within the scope of the appended claims, the invention may be practiced otherwise than as specifically described.

What is claimed is:

1. A process for making chip carriers with an anodized aluminum substrate comprising:
   punching registration and center holes in an aluminum substrate;
   anodizing the aluminum substrate;
   coating the top surface of said substrate with adhesive;
   laminating a thin metal foil to said top surface;
   coating said metal surface with photo resist;
   pin registration printing the image of a circuit by masking said photo resist covered metal surface with a photo template registered to said substrate and irradiating the exposed photo resist;
   developing the image of the electrical circuit by removing the exposed or non-exposed portions of the photo resist;
   etching the bared developed portions of said thin metal foil to form leads;
   recoating the substrate with photo resist;

exposing the photoresist in areas overlying said leads to radiation;

baring said leads by developing of the photoresist;

plating said leads with thick nickel;

exposing the remainder of said photoresist to bare the remainder of said circuit; and activating and plating said circuit, said circuit comprising the nickel coated leads and the bared metal foil, with gold.

2. The process of claim 1 wherein said step or printing and developing said image further includes coating the back surface of said substrate with screen resist to protect the metal foil extending over said punched holes.

3. A process for making chip carriers with an anodized aluminum substrate comprising:

punching registration and center holes in an aluminum substrate;

anodizing the aluminum substrate;

coating the top surface of said substrate with adhesive;

laminating a thin metal foil to said top surface;

coating said metal surface with photo resist;

pin-registration printing the image of a circuit by masking said photo resist covered metal surface with a photo template registered to said substrate and irradiating the exposed photo resist;

developing the image of said electrical circuits by removing the exposed or non-exposed portions of the photo resist;

plating said circuit with gold;

removing the resist;

etching the bared developed portions of said foil to form leads;

recoating said substrate with photo resist;

exposing the photoresist in areas overlying said leads to radiation;

baring said leads by developing of the photoresist;

activating said circuit;

plating said leads with nickel to build up thickness;

plating the entire circuit, said circuit comprising the gold plated areas and the gold and nickel plated leads, with gold; and removing the resist.

4. The process of claim 3 wherein said step of printing and developing the image further includes coating the back surface of said substrate with screen resist, to protect the metal foil extending over said punched holes.

5. The process of claim 3 wherein said step of removing the resist further includes coating the back surface of said substrate with screen resist, to protect the metal foil extending over said punched holes.

* * * * *